(12) United States Patent
Nakamura et al.

(10) Patent No.: US 8,339,025 B2
(45) Date of Patent: Dec. 25, 2012

(54) LUMINESCENT CERAMIC AND LIGHT-EMITTING DEVICE USING THE SAME

(75) Inventors: Toshitaka Nakamura, Oceanside, CA (US); Hironaka Fujii, Carlsbad, CA (US); Hiroaki Miyagawa, Oceanside, CA (US); Rajesh Mukherjee, Irvine, CA (US); Bin Zhang, San Diego, CA (US); Amane Mochizuki, San Diego, CA (US)

(73) Assignee: Nitto Denko Corporation, Osaka (JP)

( * ) Notice: Subject to any disclaimer, the term of this patent is extended or adjusted under 35 U.S.C. 154(b) by 239 days.

(21) Appl. No.: 12/787,800

(22) Filed: May 26, 2010

(65) Prior Publication Data

US 2010/0301739 A1    Dec. 2, 2010

Related U.S. Application Data

(60) Provisional application No. 61/183,004, filed on Jun. 1, 2009.

(51) Int. Cl.
*H01J 1/62* (2006.01)
*H01J 63/04* (2006.01)

(52) U.S. Cl. .......................................... 313/484; 313/503

(58) Field of Classification Search .................. 313/503, 313/502, 501, 484; 252/301.4 R–301.4 H
See application file for complete search history.

(56) References Cited

U.S. PATENT DOCUMENTS

| | | | |
|---|---|---|---|
| 5,032,568 A | 7/1991 | Lau et al. | |
| 5,061,682 A | 10/1991 | Aksay et al. | |
| 5,200,595 A | 4/1993 | Boulos et al. | |
| 5,321,223 A | 6/1994 | Kimrey et al. | |
| 5,369,091 A | 11/1994 | Fortunati et al. | |
| 5,401,484 A | 3/1995 | Wurmbauer et al. | |
| 5,447,708 A | 9/1995 | Helble et al. | |
| 5,560,844 A | 10/1996 | Boulos et al. | |
| 5,599,511 A | 2/1997 | Helble et al. | |
| 5,609,921 A | 3/1997 | Gitzhofer et al. | |
| 5,625,256 A | 4/1997 | Tiedt et al. | |
| 5,644,193 A | 7/1997 | Matsuda et al. | |
| 5,998,925 A | 12/1999 | Shimizu et al. | |
| 6,059,936 A | 5/2000 | Cathey et al. | |

(Continued)

FOREIGN PATENT DOCUMENTS

EP    1 473 348 A1    11/2004

(Continued)

OTHER PUBLICATIONS

Bouyer, et al., "Suspension plasma spraying for hydroxyapatite powder preparation by RF Plasma", IEEE Transactions on Plasma Science 25(5): 1066-1072 (1997).

(Continued)

*Primary Examiner* — Mariceli Santiago
*Assistant Examiner* — Glenn Zimmerman
(74) *Attorney, Agent, or Firm* — Knobbe, Martens, Olson & Bear, LLP

(57) ABSTRACT

Some embodiments provide luminescent ceramics which have a lower amount of dopant than conventional luminescent ceramics. In some embodiments, the luminescent ceramic comprises a host material comprising a rare earth element and at least one rare earth dopant, wherein the rare earth dopant may be about 0.01% to 0.5% of the rare earth atoms present in the material. Some embodiments provide luminescent ceramic comprising: a polycrystalline phosphor represented by the formula $(A_{1-x}E_x)_3B_5O_{12}$. Some embodiments provide a light-emitting device comprising a luminescent ceramic disclosed herein.

17 Claims, 5 Drawing Sheets

U.S. PATENT DOCUMENTS

| | | | |
|---|---|---|---|
| 6,180,029 B1 | 1/2001 | Hampden-Smith et al. | |
| 6,482,387 B1 | 11/2002 | Glgn et al. | |
| 6,601,776 B1 | 8/2003 | Oljaca et al. | |
| 6,656,588 B1 | 12/2003 | Laine et al. | |
| 6,844,285 B1 | 1/2005 | Wei | |
| 6,884,514 B2 | 4/2005 | Simpson et al. | |
| 6,905,636 B2 | 6/2005 | Yuan et al. | |
| 6,994,837 B2 | 2/2006 | Boulos et al. | |
| 7,025,756 B2 | 4/2006 | Frazier et al. | |
| 7,112,758 B2 | 9/2006 | Ma et al. | |
| 7,126,274 B2 | 10/2006 | Shimizu et al. | |
| 7,220,398 B2 | 5/2007 | Sutorik et al. | |
| 7,253,129 B2 | 8/2007 | Takagimi et al. | |
| 7,361,938 B2 | 4/2008 | Mueller et al. | |
| 2003/0094596 A1 | 5/2003 | Kijima et al. | |
| 2003/0111644 A1* | 6/2003 | Chen et al. | 252/301.4 R |
| 2003/0116080 A1 | 6/2003 | Huang | |
| 2004/0101617 A1 | 5/2004 | Devi et al. | |
| 2004/0145308 A1 | 7/2004 | Rossner et al. | |
| 2005/0269582 A1 | 12/2005 | Mueller et al. | |
| 2005/0271566 A1 | 12/2005 | Yadav | |
| 2006/0045811 A1 | 3/2006 | Sugiyama | |
| 2006/0051505 A1 | 3/2006 | Kortshagen et al. | |
| 2006/0124951 A1 | 6/2006 | Sakata et al. | |
| 2006/0125410 A1* | 6/2006 | Duggal et al. | 315/169.3 |
| 2006/0250069 A1 | 11/2006 | Sakata et al. | |
| 2006/0265088 A1 | 11/2006 | Warford et al. | |
| 2007/0029291 A1 | 2/2007 | Boulos et al. | |
| 2007/0126017 A1 | 6/2007 | Krames et al. | |
| 2007/0272664 A1 | 11/2007 | Schroder et al. | |
| 2008/0020139 A1 | 1/2008 | Arbab et al. | |
| 2008/0108496 A1 | 5/2008 | Gratson et al. | |
| 2008/0138538 A1* | 6/2008 | Lewis et al. | 428/1.1 |
| 2008/0187746 A1 | 8/2008 | De Graaf et al. | |
| 2008/0258109 A1* | 10/2008 | Kang et al. | 252/301.4 R |
| 2008/0265749 A1* | 10/2008 | Bechtel et al. | 313/503 |
| 2009/0128738 A1* | 5/2009 | Matsumoto et al. | 349/64 |
| 2009/0212697 A1* | 8/2009 | Nakamura et al. | 313/506 |
| 2009/0262428 A1* | 10/2009 | Kurokawa | 359/599 |

FOREIGN PATENT DOCUMENTS

| | | | |
|---|---|---|---|
| EP | 1 588 991 A1 | 10/2005 | |
| JP | 4-119914 A | 4/1992 | |
| WO | WO 2006/097876 A1 | 9/2006 | |
| WO | WO 2007/107915 A1 | 9/2007 | |
| WO | WO 2007/107917 A2 | 9/2007 | |
| WO | WO 2008/025723 A1 | 3/2008 | |
| WO | WO 2008026540 A1 * | 3/2008 | |
| WO | WO 2008/112710 | 9/2008 | |

OTHER PUBLICATIONS

Castillo, et al., "Inductively Coupled Plasma Synthesis of CeO2-based Powders from Liquid Solutions for SOFC Electrolytes", Plasma Chemistry and Plasma Processing, 25(2): 87-107 (2005).

Chaim, Journal of European Ceram Society, 27 (2007):3331-3337.

Fauchais, et al., "Parameters Controlling Liquid Plasma Spraying: Solutions, Sols, or Suspensions", Journal of Thermal Spray Technology, vol. 17(1), 31-59, Mar. 2008.

Fernandez de la Mora, et al., "Electrospray Atomization: Fundamentals and Its Application in Nanoparticles Technology", Journal of Aerosol Science, 28(1): S63 (1997).

Girshick, et al., "Particle nucleation and growth in thermal plasmas", Plasma Sources Science and Technology, 3: 288-394 (1994).

Goortani, et al., "Controlling nanostructure in thermal plasma processing: Moving from highly aggregated porous structure to spherical silica nanoparticles", Powder Technology, 175, 22-32, 2007.

Hess, et al., "Medication Nebulizer Performance. Effects of Diluent Volume, Nebulizer Flow, and Nebulizer Brand", American College of Chest Physicians, 110: 498-505 (1996).

Hosokawa, et al., "Defect structure of rare earth aluminium garnets obtained by the glycothermal method." Journal of Alloys and Compounds, (2007).

Inoue, "Glycothermal Synthesis of Metal Oxides" Journal of Physics: Condensed Matter, Institute of Physics Publishing, Bristol, GB, vol. 16, No. 14, Apr. 14, 2004, pp. S1291-S1303, XP020059410, ISSN: 0953-8984.

Inoue, et al., "Glycothermal Synthesis of rare earth aluminum garnets", Journal of Alloys and Compounds (1995), 226, 146-151.

Inoue, et al., "Reaction of Aluminum Alkoxides with Various Glycols and the Layer Structure of Their Products", J. Chem. Soc. Dalton Trans. 3331-3336 (1991).

Inoue, et al., "Synthesis of Yttrium Aluminum Garnet by the Glycothermal Method", J. Am. Ceram. Soc., 74 [6] 1452-54 (1991).

International Preliminary Report on Patentability in PCT/US2008/056552, dated May 13, 2009.

International Search Report and Written Opinion in PCT/US2008/056552, dated Jun. 12, 2008.

International Search Report and Written Opinion in PCT/US2009/033689, dated Jun. 16, 2010.

International Search Report and Written Opinion in PCT/US2010/036224, dated Jul. 16, 2010.

International Search Report for PCT/US2009/034574; Publication No. WO 2009/105581) dated Apr. 28, 2009.

Jung, et al., "Morphology control and luminescent property of Y3Al5O12:Tb particles prepared by spray pyrolysis," Materials Research Bulletin, 40, 2212-2218 (2005).

Kagawa, et al., "Gas-phase synthesis of ultrafine particles and thin films of Y-Al-O by the spray-ICP technique", Journal of Aerosol Science, 24(3): 349-355 (1993).

Kang, et al.,"YAG:Ce phosphor particles prepared by ultrasonic spray pyrolysis," Material Research Bulletin, 35, 789-798 (2000).

Kasuya, et al., "Characteristic optical properties of transparent color conversion film prepared from YAG:Ce3+ nanoparticles", Applied Physics Letters, Sep. 14, 2007, vol. 91, No. 11, pp. 111916-111916, XP012099134.

Kasuya, et al., "Glycothermal synthesis and photoluminescence of YAG:Ce3+ nanophosphors", Journal of Alloys and Compounds 408-412 (2006), 820-823.

Kasuya, et al., "Photoluminescence Enhancement of PEG-Modified YAG:Ce3+ Nanocrystal Phosphor Prepared by Glycothermal Method", Journal of Phys. Chem. B (2005), 109, 22126-22130.

Kumar, et al., "GRF Plasma Processing of Ultra-Fine Hydroxyaptite Powders", Journal of Materials Processing Technology, 113: 456-462 (2001).

Lenggoro, et al., "GPreparation of ZnS Nanoparticles by Electrospray Pyrolysis", Journal of Aerosol Science, 31(1): 121-136 (2000).

Leparoux, et al., "Induction Plasma Synthesis of Carbide Nano-Powders", Advanced Engineering Materials, 7(5): 349-353 (2005).

Li et al., "RF plasma processing of Er-doped T102 luminescent nanoparticles" Thin Solid Films, Elsevier-Sequoia S.A. Lausanne, CH, vol. 506-507, May 26, 2006, pp. 292-296, XP005352150, ISSN: 0040-6090, pp. 292-294.

Loffert, et al., "IA Comparison of Commercial Jet Nebulizers", American College of Chest Physicians, 106: 1788-1792 (1994).

Mangolini et al., "Plasma synthesis and liquid-phase surface passivation of brightly luminescent Si nanocrystals" Journal of Luminescence, Amsterdam, NL, vol. 121, No. 2, Dec. 1, 2006, pp. 327-334, XP005719171, ISSN: 0022-2313.

Marchal, et al., "Yttrium Aluminum Garnet Nanopowders Produced by Liquid-Feed Flame Spray Pyrolysis (LF-FSP) of Metalloorganic Precursors", Chemistry of Materials, 16: 822-831 (2004).

Maric, et al., "Synthesis of Oxide Nanopowders in NanoSpraySM Diffusion Flames", Materials & Manufacturing Processes, 19(6): 1143-1156 (2004).

May, "The collison nebulizer: Description, performance and application", Journal of Aerosol Science, 4(3): 235-238 (1973).

McKittrick, et al., "The influence of processing parameters on luminescent oxides produced by combustion synthesis", Displays 19, 169-172, 1999.

McLean, et al., "DA Direct Injection High-Efficiency Nebulizer for Inductively Coupled Plasma Mass Spectrometry", Journal of Anal. Chem., 70(5): 1012-1020 (1998).

Mizoguchi, et al., "Deposition of TiO2 on heated substrates by the spray-inductively-coupled-plasma technique", Journal of Materials Science Letters, 12(23): 1854-1855 (1993).

Mizoguchi, et al., "Film Synthesis of Y3Al5O12 and Y3Fe5O12 by the Spray-Inductively Coupled Plasma Technique", Journal of Am. Ceram. Soc., 84(3): 651-53 (2001).

Mueller, et al., "Nanoparticle synthesis at high production rates by flame spray pyrolysis", Chemical Engineering Science, 58(10): 1969-1976 (2003).

Nyman, et al., "Comparison of Solid-State and Spray-Pyrolysis Synthesis of Yttrium Aluminate Powders", Journal of the American Ceramic Society, 80(5): 1231-1238 (1997).

Parukuttyamma, et al., "Deposition and Characterization of Y3Al5O12 (YAG) Films and Powders by Plasma Spray Synthesis", MRS Fall Meeting (Symposium GG). vol. 658 MRS: Boston. pp. 6 (2000).

Parukuttyamma, et al., "Yttrium Aluminum Garnet (YAG) Films through a Precursor Plasma Spraying Technique", Journal of the American Ceramic Society, 84(8): 1906-1908 (2001).

Purwanto, et al., "High luminance YAG:Ce nanoparticles fabricated from urea added aqueous precursor by flame process", Journal of Alloys and Compounds 463, 350-357, 2008.

Ravi, et al., "Liquid Precursor Plasma Spraying of Functional Materials: A Case Study for Yttrium Aluminum Garnet (YAG)", Journal of Thermal Spray Technology, 17(1): 82-90 (2008).

Ribeiro, et al., "Coupling of Ultrasonic Nebulization to Flame Furnce Atomic Absorption Spectrometry—New Possibilities for Trace Element Determination", Microchemical Journal, 85(2): 341-346 (2007).

Ryu, J Electrochem soc vol. 155 (4) J99-J104 (2008).

Schiller, et al., "Preparation of perovskite powders and coatings by radio frequency suspension plasma spraying", Journal of Thermal Spray Technology, 8(3): 389-392 (1999).

Shan, et al., "Numerical Simulation of Droplet Breakup and Collision in the Solution Precursor Plasma Spraying", Journal of Thermal Spray Technology, 698—vol. 16(5-6), Dec. 2007.

Sun, Y., et al., "Management of singlet and triplet excitons for efficient white organic light-emitting devices" Nature 440, 908-912, 2006.

Written Opinion in PCT/US2009/034574; Publication No. WO 2009/105581) dated Apr. 28, 2009.

Young and Pfender, "Generation and Behavior of Fine Particles in Thermal PlasmasmA Review", Plasma Chemistry and Plasma Processing, vol. 5, No. 1, 1985.

Young, et al., "Continuous Aerosol Therapy System Using a Modified Collison Nebulizer", Journal of Clinical Microbiology, 5(2): 131-136 (1977).

Zhu, et al., "RF Plasma Synthesis of YBa2Cu3O7_x Powders", Journal of Superconductivity, vol. 3, No. 2, 1990.

Kang, et al., "YAG:Ce phosphor particles prepared by ultrasonic spray pyrolysis, "Materials Research Bulletin 35 (2000) 789-798.

* cited by examiner

LUMINESCENT CERAMIC AND LIGHT-EMITTING DEVICE USING THE SAME

CROSS-REFERENCE TO RELATED APPLICATIONS

This application claims the benefit of U.S. Provisional Patent Application No. 61/183,004, filed Jun. 1, 2009, which is incorporated by reference herein in its entirety.

BACKGROUND OF THE INVENTION

1. Field of the Invention

This invention relates to luminescent ceramics, such as those used in light-emitting devices.

2. Description of the Related Art

White light-emitting diodes (LED) are well-known solid state lighting devices and have been widely put to practical use. Examples of uses of LEDs include indicators for various instruments, backlighting for LCD displays used in cellular phones, signboards, ornamental illumination, etc. For some applications, it is difficult to obtain an LED which emits light in the color range desired for the application. For example, many LEDs emit blue light, but often white light is desired for a device. In these situations, phosphors can be used to change the color of the emitted light. This is done by allowing blue or some other colored light emitted from the LED to pass through the phosphor. Some of the light passes through the phosphor unaltered, but some of the light is absorbed by the phosphor, which then emits light of a different wavelength. Thus, the phosphor tunes the apparent color of the emitted light by converting part of the light to light of a different wavelength. Many white light-emitting devices are based upon this type of color conversion. For example, one type of conventional white-light emitting device comprises a blue-LED and yellow light emitting YAG phosphor powder dispersed in encapsulant resin such as epoxy or silicone.

The luminous efficiency of LEDs has improved in recent years. As a result, LED use may expand to white light-emitting devices which require more luminance intensity such as headlights for automobiles, backlighting for mid- to large-size LCD displays, and general lighting replacing current fluorescent and incandescent lamps. For these applications, it may be helpful have a light-emitting device that maintains its emission efficiency under higher driving conditions and greater emission flux. In some instances, higher driving conditions may greatly increase heat generation in the LED device, and this increased temperature may reduce both LED efficiency and device lifetime. For example, a temperature rise may cause a reduction of the internal quantum efficiency of an LED semiconductor chip and a shortening of the encapsulant resin's lifetime. Recently, LED devices have been prepared which use a luminescent ceramic plate instead of a powder. This has helped reduce thermal quenching somewhat, possibly due to the better thermal conductivity of the plate as compared to a powder dispersed in a resin. However, thermal quenching remains a problem even for ceramic plates.

SUMMARY OF THE INVENTION

Some embodiments provide luminescent ceramics for use in light-emitting devices. These ceramics tend to have a lower amount of dopant than conventional luminescent ceramics in general use. In some embodiments, the luminescent ceramic comprises a host material comprising a rare earth element and at least one rare earth dopant, wherein the rare earth dopant may be about 0.01% to 0.5% of the rare earth atoms present in the material. Some embodiments provide a luminescent ceramic comprising: a polycrystalline phosphor represented by the formula $(A_{1-x}E_x)_3B_5O_{12}$; wherein A is Y, Gd, La, Lu, Tb, or a combination thereof; x is in the range of about 0.0001 to about 0.005; B is Al, Ga, In, or a combination thereof; and E is Ce, Eu, Tb, Nd, or a combination thereof; wherein the ceramic has a wavelength of maximum absorbance in the range of about 420 nm to about 480 nm.

Some embodiments provide a luminescent ceramic comprising: a polycrystalline phosphor represented by the formula $(Y_{1-(x+y)}Gd_yCe_x)_3B_5O_{12}$, wherein x and B are the same as those described above, and y is in the range of about 0.005 to about 0.05.

Some embodiments provide a light-emitting device comprising: a light-emitting diode having a wavelength of maximum emission in the range of about 420 nm to about 480 nm, and a luminescent ceramic as disclosed herein, wherein the luminescent ceramic is positioned to receive and convert at least a portion of the light emitted from the light-emitting diode to light having a wavelength of maximum emission in the range of about 500 nm to about 700 nm.

These and other embodiments are described in greater detail below.

Figure 1:
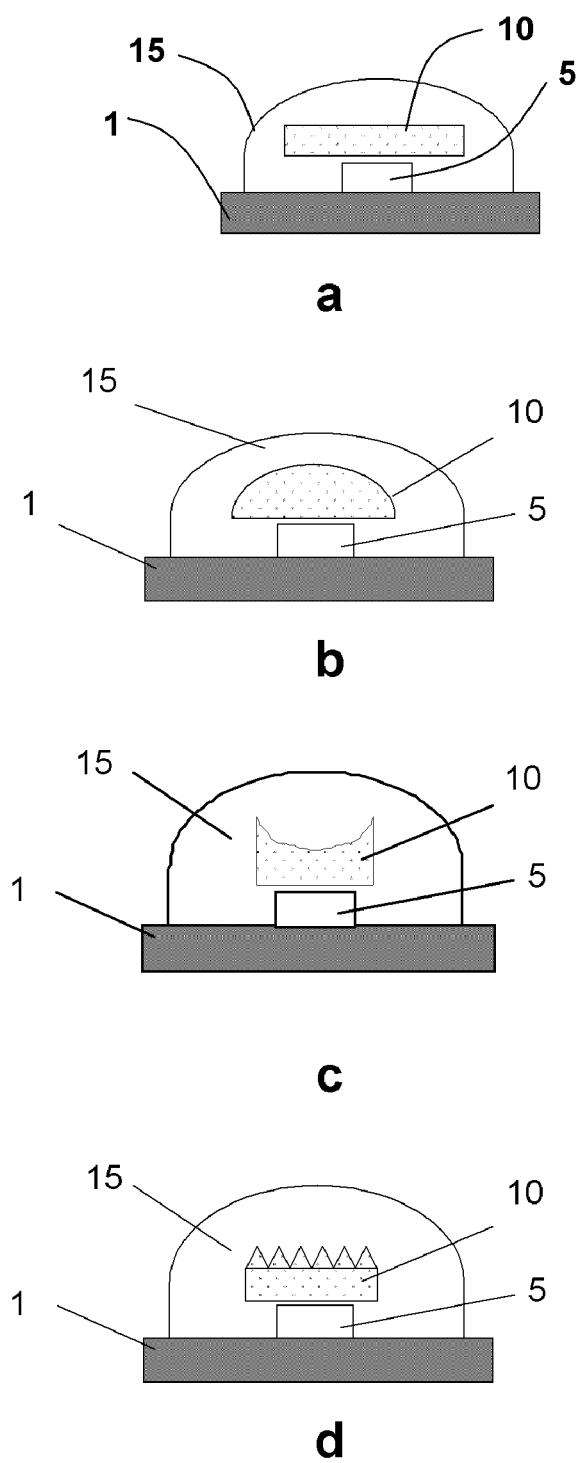
FIG. 1 is a schematic diagram of some examples of a device comprising a luminescent ceramic as disclosed herein.

The drawings are not to scale.

DETAILED DESCRIPTION OF THE PREFERRED EMBODIMENTS

Some of the embodiments disclosed herein provide a light-emitting device comprising a luminescent ceramic which has a lower amount of dopant than conventional luminescent ceramics in general use. In some embodiments, the luminescent ceramic comprises a polycrystalline phosphor with a low dopant concentration represented by formulas such as, but not limited to $(A_{1-x}E_x)_3B_5O_{12}$, $(Y_{1-x}E_x)_3B_5O_{12}$; $(Gd_{1-x}E_x)_3B_5O_{12}$; $(La_{1-x}E_x)_3B_5O_{12}$; $(Lu_{1-x}E_x)_3B_5O_{12}$; $(Tb_{1-x}E_x)_3B_5O_{12}$; $(A_{1-x}E_x)_3Al_5O_{12}$; $(A_{1-x}E_x)_3Ga_5O_{12}$; $(A_{1-x}E_x)_3In_5O_{12}$; $(A_{1-x}Ce_x)_3B_5O_{12}$; $(A_{1-x}Eu_x)_3B_5O_{12}$; $(A_{1-x}Tb_x)_3B_5O_{12}$; $(A_{1-x}E_x)_3Nd_5O_{12}$; and the like. In some embodiments, the ceramic comprises a garnet, such as a yttrium aluminum garnet, with a low dopant concentration. Some embodiments provide a composition represented by the formula $(Y_{1-x}Ce_x)_3Al_5O_{12}$. Some embodiments provide a composition represented by the formula $(Y_{1-(x+y)}Gd_y Ce_x)_3Al_5O_{12}$. In any of the above formulas, x may be in the range of about 0.0001 to about 0.005, from about 0.0005 to about 0.004, or alternatively, from about 0.0008 to about 0.0025. In some embodiments, y may be in the range of about 0.005 to about 0.05, from about 0.01 to about 0.03, or alternatively 0.015 to about 0.025.

The luminescent ceramics disclosed herein may be useful to absorb light emitted from a light-emitting diode and emit light of a different color, thus allowing tuning of the color. In some embodiments, the luminescent ceramic may absorb blue light and emit yellow light. For example, in some embodiments, the ceramic has a wavelength of maximum absorbance in the range of about 420 nm to about 480 nm, and a wavelength of maximum emission in the range of about 500 nm to about 750 nm, or alternatively, about 500 nm to about 600 nm.

Although the absorption-emission profile of a luminescent ceramic and the dopant concentration may affect the color of a light-emitting device, these are not the only tools available to tune the color. For example, without being limiting, the color may also be tuned by varying the thickness of the luminescent ceramic and/or by adding additional luminescent ceramics of various colors such as green, blue, and red.

In some embodiments, the luminescent ceramic may be made thicker to increase the amount of light emitted from the light-emitting diode which is converted to light of a different wavelength. Thus, the observed light will appear less like the color of the light-emitting diode and more like the color of the ceramic. Alternatively, the luminescent ceramic may be made thinner to decrease the amount of converted light, thus making the color appear more similar to that of the light-emitting diode. For example, in the case that the light-emitting diode emits blue light and the luminescent ceramic is yellow, or emits yellow light, a thinner ceramic may yield light which appears more blue, and a thicker ceramic may yield light which appears more white or yellow. In some embodiments, the luminescent ceramic has a thickness in the range of about 50 μm to about 5 mm, about 0.2 mm to about 2 mm, or alternatively, about 1 mm. The geometry of the luminescent ceramic may also affect the color of the emitted light since the effective thickness of the luminescent ceramic may depend upon the path the light takes through the ceramic. In some embodiments, the luminescent ceramic is a flat plate. In other embodiments, the luminescent ceramic is dome-shaped, convex, concave, capped, a plate with relief structure, a plate with a microlens structure, or the like.

In some embodiments, at least one additional component, e.g., a luminescent ceramic, is added to the device to tune the color of the light emitted by a device. The additional component may include any type of luminescent ceramic, and it may be of any color, such as red, blue, green, etc. Some embodiments provide a luminescent ceramic, or an additional luminescent ceramic, comprising a rare earth host material with a rare earth dopant, wherein the amount of rare earth dopant is in the range of about 0.01% to about 0.05%, or alternatively about 0.01% to 0.02% of the rare earth atoms in the ceramic. Some embodiments provide a luminescent ceramic comprising $(Sr,Ca,Ba)_2SiO_4$:Eu, $Ca_3SC_2Si_3O_{12}$:Ce, $CaSc_2O_4$:Ce, $Ca_3SiO_4Cl_2$:EU, $Sr_3SiO_5$:EU, $Ca_3Si_2O_7$:Eu, $CaAl_{12}O_{19}$:Mn, $SrAl_2O_4$:Eu, $Ba_3MgSi_2O_8$:Eu, $BaMgAl_{10}O_{17}$:Eu, $La_2O_2S$:Eu, $SrGa_2S_4$:Eu, $CaAlSiN_3$:Eu, $Ca_2Si_5N_8$:Eu, and CaSiAlO-N:Eu, wherein the element following the colon is the dopant (for example, Ce is the dopant in $Ca_3Sc_2Si_3O_{12}$:Ce). The additional component, e.g., luminescent ceramic, may be in any form. In some embodiments, the additional luminescent ceramic is any form described above for the luminescent ceramic, such as flat plate. In some embodiments, the additional luminescent ceramic is in the form of particles dispersed in another part of the device, such as in a resin encapsulating the device.

In some embodiments, the low dopant concentration of the luminescent ceramic may reduce thermal quenching. In some embodiments, this may provide better thermal stability of the luminous efficiency to a light-emitting device, or in other words provide more stable luminous efficiency at high temperatures. In some embodiments, this may improve the thermal stability of the color, or in other words provide a more stable color at higher temperatures. In some embodiments, the luminescent ceramic has a first luminescent efficiency at 200° C. and a second luminescent efficiency at 25° C., wherein the first luminescent efficiency is at least about 80%, 82%, 85%, 87% or alternatively 90% of the second luminescent efficiency. In some embodiments, these luminescence efficiencies are determined at the wavelengths of peak emission of the luminescent ceramic. The particular value may vary according to the phosphor material and the activator concentration. In some embodiments, the luminescence efficiency of a luminescent ceramic comprising a cerium doped yttrium aluminum garnet (YAG:Ce) is determined by irradiating the ceramic at about 450-470 nm, or alternatively about 460 nm, and measuring luminescence at about 500-600 nm, about 510-550, or alternatively about 530 nm.

The luminescent ceramic may be transparent or translucent. However, in some instances small defects in the luminescent ceramic, such as air voids, may cause backscattering loss of light from a light-emitting diode. Normally, the number of defects in a luminescent ceramic material is small, and the backscattering loss is minimal. However, in some instances, since the number of defects may be small, it may difficult to obtain consistent scattering levels in the ceramic. Thus, in some embodiments, additional defects may be added which may increase the scattering, but may provide better consistency in the scattering from one ceramic to another. In some embodiments, the total light transmittance of the luminescent ceramic, measured at about 800 nm, is greater than or equal to about 50%, or alternatively about 60%, to about 70%, or alternatively about 80%. In some embodiments, additional scattering may be provided by controlling air void density or alien crystal phase growth (non-polycrystalline phase material). In some embodiments, the luminescent ceramic further comprises a second component, e.g., at least a second ceramic material. In some embodiments, the second ceramic material is selected from at least one of: yttrium aluminum garnet powder; amorphous powders comprising yttrium, aluminum, oxygen, and/or cerium; $YAlO_3$:Ce; $Al_2O_3$ powders; alumina; yttria; and yttrium aluminum oxide.

There are many methods generally known in the art that may be applied to prepare the luminescent ceramics disclosed herein. In some embodiments, the luminescent ceramics are prepared by methods such as commonly known ceramic body fabrication procedures, including molded ceramic green compact preparation. In some embodiments, conventional molded ceramic compact manufacturing processes using ceramics raw powders with properly added polymer based binder materials and/or flux (such as $SiO_2$ and/or MgO), dispersant, and/or solvent may be employed. In some embodiments, particle size may be important. For example, if the particle size becomes too large, it may become difficult to achieve the desired highly dense ceramic because large particles may not easily agglomerate or fuse to each other, even at high sintering temperature. Furthermore, increased particle size may increase the number of air voids in the ceramic layer. On the other hand, smaller nano-sized particles may have an increased ability to fuse with one another, which may result in highly dense and air void-free ceramic elements. In some embodiments, the raw powders used to prepare luminescent ceramics may be nano-sized particles with an average particle size no greater than about 1000 nm, or alternatively, no greater than about 500 nm.

In some embodiments, binder resin, dispersant, and/or solvent may be added to the raw powder during mixing and/or molding to facilitate the fabrication process. In some embodiments, the mixing process may employ equipment such as a mortar and pestle, a ball milling machine, a bead milling machine, etc. In some embodiments, the molding process utilizes methods such as simple die pressing, monoaxial pressing, hot isostatic pressing (HIP), and cold isostatic pressing (CIP). In some embodiments, to control the thickness of ceramic layer, controlled quantities of raw powders are loaded in a mold followed by applying pressure. In some embodiments, slip casting of slurry solution can be utilized to make a molded ceramic green compact. In some embodiments, the luminescent ceramic may be prepared by using flexible ceramic green sheet prepared by a tape casting method as widely employed in the multi-layer ceramic capacitor manufacturing process.

In some embodiments, the molded ceramic green body may be heat treated in an oxygen atmosphere, such as air, to remove binder resin or any other residues. The heat-treating may be carried out at any temperature higher than the temperature that the decomposition of the binder resin starts, but lower than the temperature at which the pores on the surface of the sample are closed off. In some embodiments, the heat-treating may comprise heating at a temperature in the range of 500° C. to 1000° C. for a time in the range of about 10 min to about 100 hr. The conditions may depend on binder resin decomposition speed, and may be adjusted to prevent warping and/or a deformation of ceramic green body.

Next, in some embodiments, sintering may be performed under a controlled atmosphere to provide void-free luminescent ceramics. The sintering temperature range depends on ceramic material being sintered, average particle size of raw powder, and density of ceramic green compact. In some embodiments where the ceramic comprises YAG:Ce, the sintering temperature may be in the range of about 1450° C. to about 1800° C. While any suitable sintering ambient condition may be employed, in some embodiments, the sintering ambient may be a vacuum; an inert gas such as helium, argon, and nitrogen; or a reducing gas such as hydrogen or mixture of hydrogen and inert gas.

The light emitting device comprising the luminescent ceramics disclosed herein may be any device that emits light. In one embodiment, a light emitting device may be a light emitting diode (LED), an organic light emitting diode (OLED), or an inorganic electroluminescent device (IEL).

Figure 2:
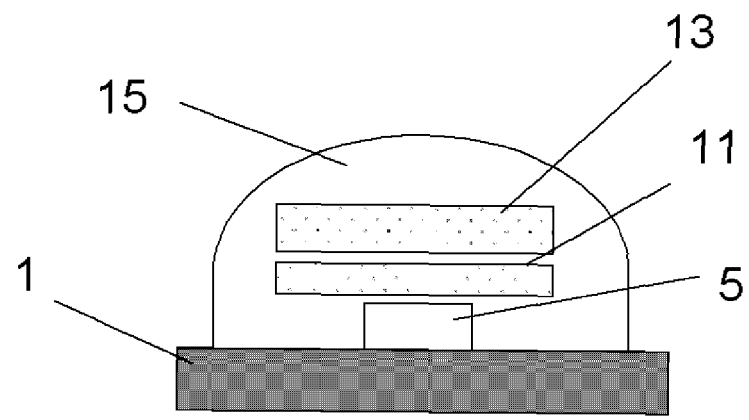
FIG. 2 is a schematic diagram of an example of a device comprising a luminescent ceramic as disclosed herein and an additional ceramic in plate form.

In some embodiments, the luminescent ceramics may be mounted into a blue-LED to yield a device that emits light that appears more white. FIG. 1 shows some examples of such a device's structure. In this device, the blue-LED 5 is fixed to a substrate 1, and the luminescent ceramic 10 is positioned so that the blue-LED 5 is between the ceramic 10 and the substrate 1. The blue-LED 5 and ceramic 10 are encapsulated by a resin 15, which is attached to the substrate 1. While the shape of the ceramic 10 is not limited, a few examples of shapes for ceramic 10 are a flat plate, FIG. 1a; convex, FIG. 1b; concave, FIG. 1c, and a textured plate, FIG. 1d Some embodiments comprise an additional luminescent ceramic. For example, one embodiment, illustrated in FIG. 2 has a blue-LED 5 fixed to a substrate 1. A red light-emitting luminescent ceramic 11 is positioned so that the blue-LED 5 is between the red light-emitting ceramic 11 and the substrate 1. A yellow-emitting luminescent ceramic 13 is disposed over the red light-emitting ceramic 11 so that light emitted by or passing through the red light-emitting ceramic 11 will then pass through the yellow-emitting luminescent ceramic 13. The blue-LED 5, the red light-emitting ceramic 11, and the yellow-emitting luminescent ceramic 13 are encapsulated by a resin 15, which is attached to the substrate 1.

Figure 3:
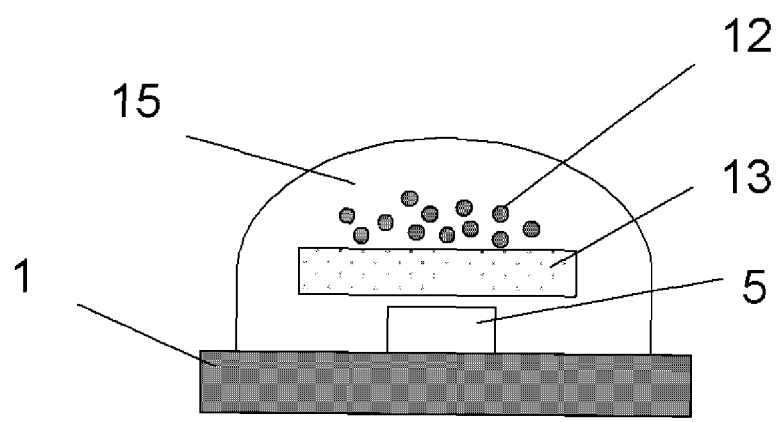
FIG. 3 is a schematic diagram of an alternate example of a device comprising a luminescent ceramic as disclosed herein and an additional ceramic in powder form.

In some embodiments, an additional luminescent ceramic is in a powder form. FIG. 3 shows an example of such a device's structure. In this device, the blue-LED 5 is fixed to a substrate 1, and a yellow light-emitting luminescent ceramic 13 is positioned so that the blue-LED 5 is between the yellow light-emitting luminescent ceramic 13 and the substrate 1. The blue-LED 5 and yellow light-emitting luminescent ceramic 13 are encapsulated by a resin 15, which is attached to the substrate 1. Within the resin 15, is a red light-emitting luminescent ceramic in powder form 12 is positioned above the yellow light-emitting luminescent ceramic 13 so that light emitted by or passing through the yellow light-emitting ceramic 13 will then pass through the red light-emitting luminescent ceramic in powder form 12.

Figure 4:
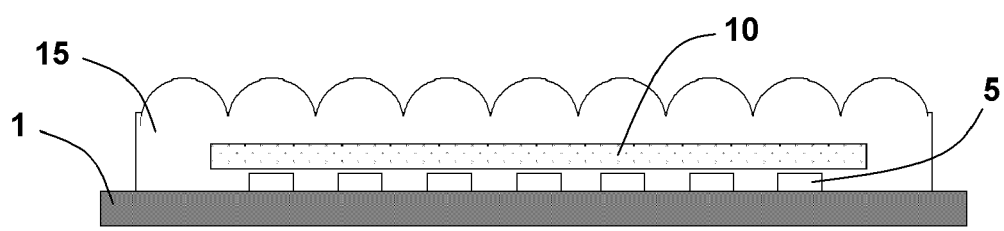
FIG. 4 is a schematic diagram of an alternate example of a device comprising a luminescent ceramic as disclosed herein.

In some embodiments, multiple LEDs may be incorporated into a light emitting device. For example, one embodiment, illustrated in FIG. 4, has several blue-LEDs 5 which are fixed to the substrate 1. The luminescent ceramic 10 in this embodiment is configured so that all of the blue-LEDs 5 are positioned between the substrate 1 and the luminescent ceramic 10. The blue-LEDs 5 and luminescent ceramic 10 are encapsulated by a resin 15, which is attached to the substrate 1.

Figure 5:
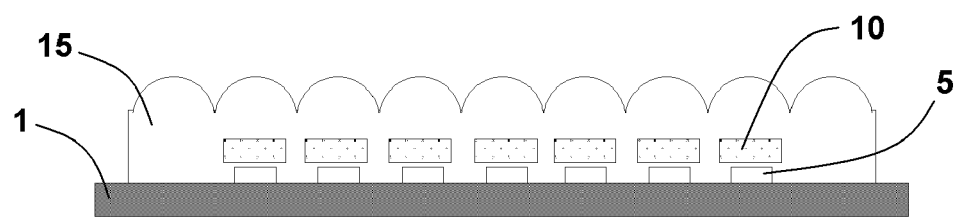
FIG. 5 is a schematic diagram of an alternate example of a device comprising a luminescent ceramic as disclosed herein.

In other embodiments, multiple emitting units comprising a blue-LED 5 and a luminescent ceramic 10 are mounted on the substrate 1. For example, another embodiment illustrated in FIG. 5 has several blue-LEDs 5 fixed to the substrate 1. A multiplicity of the luminescent ceramics 10 are each positioned such that one blue-LED 5 is positioned between the substrate 1 and one of the luminescent ceramics 10. The luminescent ceramics 10 and the blue-LEDs 5 are encapsulated by the resin 15, which is attached to the substrate.

Figure 6:
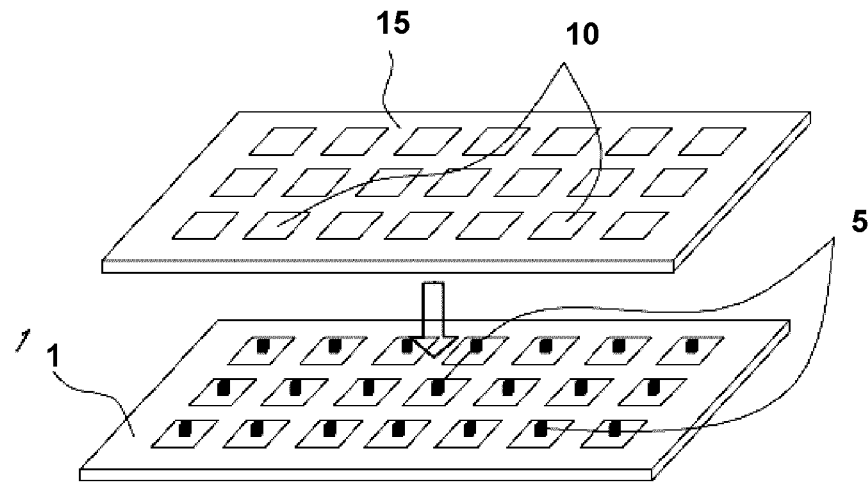
FIG. 6 is a schematic diagram of an alternate example of a device comprising luminescent ceramics as disclosed herein.

In some embodiments, array type emitting units may also be assembled to form a light emitting device. As depicted in FIG. 6, an array of blue-LEDs 5 is mounted on the substrate 1. A corresponding array of phosphor translucent ceramics plates 10 is formed by embedding the phosphor translucent ceramics plates in the encapsulant resin 15. The matching arrays of phosphor translucent ceramics plates and blue-LEDs are then combined to form a light emitting device that emits whiter light.

EXAMPLE 1

Preparation of Raw Particles by Using Inductively Coupled RF Thermal Plasma Pyrolysis Yttrium (III) nitrate hexahydrate (0.5988 mol, 229.346 g, 99.9% pure, Sigma-Aldrich), Aluminum nitrate nonahydrate (1.0 mol, 375.14 g, 99.97% pure, Sigma-Aldrich), and Cerium (III) nitrate hexahydrate (0.0012 mol, 0.521 g, 99.99% pure, Sigma-Aldrich) were dissolved in 1000 ml of deionized water. In this example, the Ce doping amount was 0.2 mol %.

This precursor solution of 1.6 M was carried into a plasma reaction chamber via an atomization probe using a liquid pump.

Deposition experiments were conducted with an RF induction plasma torch (TEKNA Plasma System, Inc PL-35 [Quebec, Canada]) operating at 3.3 MHz. RF generator plate power was in the range of 12-15 kW. Reactant injection was performed using a radial atomization probe (TEKNA Plasma System, Inc SDR-772). Crystalline phases of the deposited particles were investigated using X-ray diffraction (XRD) spectra obtained with a Rigaku Miniflex (Rigaku Americas, the Woodlands, Tex., USA)] (CuKα). The crystalline phase of the obtained sample was identified as mixture of amorphous and yttrium aluminum perovskite (YAP).

The average particle diameter ($D_{ave}$) was obtained from BET surface area measurements based on data acquired from a Micrometritics model Gemini 2365 gas sorptometer (Norcross, Ga., USA). Obtained $D_{ave}$ of the sample was 87 nm. The powder obtained was then deagglomerated with a planet ball mill using 3 mm yttria stabilized zirconia ball under water. The obtained powder was pre-annealed at 1000° C. for 2 hours under the $H_2/N_2=3\%/97\%$ mixture gas ambient. XRD showed phase pure YAG structure, and $D_{ave}$ obtained by BET measurement was 103 nm.

Preparation of Luminescent Ceramic Sample

The raw powder prepared above (with 4 g, $D_{ave}$=103 nm), Poly(vinyl butyral-co-vinyl alcohol-co-vinyl acetate) (0.21 g, average Mw 90,000-120,000 powder, Sigma-Aldrich), fumed silica powder (0.012 g, CAB-O-SIL® HS-5, Cabot Corporation, Tuscola, Ill., USA), and methanol (10 ml) were mixed by ball mill. By blowing hot air form a dryer and continually moving the pestle, methanol was completely removed to obtain a dried powder. The dried powder (400 mg) was spread out into a die set with a diameter of 13 mm (Product#: 0012-6646, 3 mm KBr Die Set, International Crystal Laboratories, Inc., Garfield, N.J., USA) followed by applying a pressure of 5000 psi using hydraulic press. The resulting ceramic green compact was heat treated at 800° C. (heating rate is 4° C./min) for 1 hr in air in order to remove binder resin.

The ceramic compact was then sintered at 1600° C. (heating rate was 2° C./min) for 5 hours in vacuum. A yellow colored translucent YAG:Ce ceramic disc with a thickness about 1 mm was obtained.

EXAMPLE 2

The general procedure of Example 1 was repeated except that Ce doping amount was changed from 0.2 mol % to 0.05 mol % by changing the composition of nitrate precursor. A yellow colored translucent YAG:Ce ceramic disc was obtained. The color of the ceramic disc was slightly paler yellow compared to the sample obtained in Example 1.

EXAMPLE 3

The general procedure of Example 1 was repeated except that Ce doping amount was changed from 0.2 mol % to 0.4 mol % by changing the composition of nitrate precursor. A yellow colored translucent YAG:Ce ceramic disc was obtained. The color of the ceramic disc was slightly deeper in color compared to the sample obtained in Example 1.

EXAMPLE 3A

The general procedure of Example 1 was repeated except that Yttrium (III) nitrate hexahydrate (0.5912 mol, 226.449 g, 99.9% pure, Sigma-Aldrich), Gadolinium (III) nitrate hexahydrate (0.0189 mol, 8.553 g, 99.99% pure, Sigma-Aldrich), Aluminum nitrate nonahydrate (1.0 mol, 375.14 g, 99.97% pure, Sigma-Aldrich), and Cerium (III) nitrate hexahydrate (0.0012 mol, 0.521 g, 99.99% pure, Sigma-Aldrich) were dissolved in 1000 ml of deionized water. In this example, the Yttrium amount was 97.8 mol %, the Gadolinium amount was 2.0 mol % and Ce doping amount was 0.2 mol %. A yellow colored translucent Y/Gd Aluminum Garnet: Ce ceramic disc was obtained. The color of the ceramic disc was slightly paler yellow compared to the sample obtained in Example 1.

COMPARATIVE EXAMPLE 1

The general procedure of Example 1 was repeated except that Ce doping amount was changed from 0.2 mol % to 0.8 mol % by changing the composition of nitrate precursor. A yellow colored translucent YAG:Ce ceramic disc was obtained. The color of the ceramic disc was deeper in color compared to the sample obtained in Example 1.

COMPARATIVE EXAMPLE 2

The general procedure of Example 1 was repeated except that Ce doping amount was changed from 0.2 mol % to 2.0 mol % by changing the composition of nitrate precursor. A yellow colored translucent YAG:Ce ceramic disc was obtained. The color of the ceramic disc was deeper in color compared to the sample obtained in Example 1.

COMPARATIVE EXAMPLE 3

The general procedure of Example 1 was repeated except that Ce doping amount was changed from 0.2 mol % to 5.0 mol % by changing the composition of nitrate precursor. A yellow colored translucent YAG:Ce ceramic disc was obtained but showed lower translucency. The color of the ceramic disc was much deeper in color compared to the sample obtained in Example 1.

COMPARATIVE EXAMPLE 4

Commercial YAG:Ce phosphor powder (Kasei Optonix, Ltd P46-Y3 [Odawara City, Kanagawa, Japan) having a median particle size around 6.6 micron meter was spread out into die set with 13 mm of diameter (Product#: 0012-6646, 3 mm KBr Die Set, International Crystal Laboratories, Inc) followed by applying a pressure of 5000 psi using hydraulic press. A YAG:Ce phosphor powder tablet with a thickness of about 1 mm was obtained.

EXAMPLE 4

$Y_2O_3$ (33.81 g, 99.99%), $Al_2O_3$ (25.49 g, 99.99%), $CeO_2$ (0.1033 g, 99.9%), and 0.5 g tetraethyl orthosilicate (TEOS, 99.99%, Sigma-Aldrich) were mixed by planetary ball mill in methanol. Poly(vinyl butyral-co-vinyl alcohol-co-vinyl acetate) (2.5 g, average Mw 90,000-120,000 powder, Sigma-Aldrich) was then added as a binder. In this example, the Ce doping amount was about 0.2 mol %.

By blowing hot air from a dryer and while continuing to move the pestle, methanol was completely removed to obtain a dried powder. The dried powder (400 mg) was spread out into a die set with a diameter of 13 mm (Product#: 0012-6646, 3 mm KBr Die Set, International Crystal Laboratories, Inc) followed by applying a pressure of 5000 psi using a hydraulic press. Then, the obtained ceramics green compact was heat treated at 800° C. (heating rate is 4° C./min) for 1 hr in air in order to remove binder resin.

The ceramic compact was then sintered at 1700° C. (heating rate was 2° C./min) for 5 hours in vacuum. A yellow colored translucent YAG:Ce ceramic disc with a thickness about 1 mm was obtained.

Evaluation of Thermal Quenching Property

Thermal quenching measurement were performed with Otsuka Electronics MCPD 7000 multi channel photo detector system together with associated optical components such as integrating spheres, light source, monochromator, optical fibers, and temperature controllable sample holder.

The obtained luminescent ceramic disc or powder tablet was irradiated with a Xe lamp (150W, L2274) at 460 nm after passing through a monochromator. An emission spectrum was acquired by using an integrating sphere. This measurement was performed over the range from 25° C. to 200° C. by 25° C. step while maintaining the same measurement condition. The peak values of the emission spectra were normalized by the value of 25° C., and then summarized in Table 1.

Figure 7:
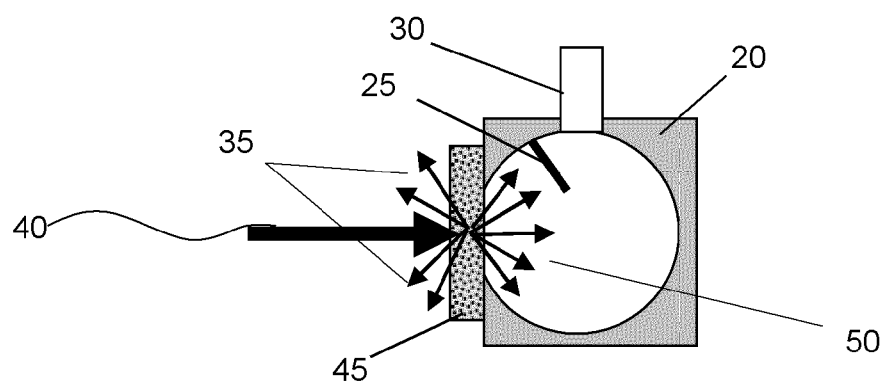
FIG. 7 shows a schematic of one embodiment of a device for measuring the total light transmittance through a luminescent ceramic plate.

The measurement system of FIG. 7 was constructed by using Otsuka Electronics MCPD 7000 multi channel photo detector system together with associated optical components such as integrating spheres, light source, optical fibers, and sample holder. The total light transmittance obtained at a wavelength of 800 nm was 73.9%.

The ceramic disc was carefully cut down into the size of around 1.5 mm×1.5 mm by using a diamond cutter. The small piece of ceramic disc was mounted into a blue LED chip by the following procedure. Casting type epoxy resin (Nitto Denko Corporation, NT8080) was used as encapsulant resin. A very small amount of epoxy resin was put onto an LED chip by using a toothpick. And then, the phosphor disk piece was carefully mounted onto the LED chip followed by curing at 135° C. for 5 hours. A LED device with a ceramic disk was driven, and white color emission was observed.

TABLE 1

| | Ce doping | | PL intensity at different temperature | | | | | | | |
|---|---|---|---|---|---|---|---|---|---|---|
| Sample | amount | Remark | 25° C. | 50° C. | 75° C. | 100° C. | 125° C. | 150° C. | 175° C. | 200° C. |
| Example 1 | 0.20% | Ceramic | 1.000 | 0.992 | 0.988 | 0.975 | 0.966 | 0.949 | 0.918 | 0.889 |
| Example 2 | 0.05% | Ceramic | 1.000 | 0.994 | 0.990 | 0.977 | 0.965 | 0.955 | 0.934 | 0.911 |
| Example 3 | 0.40% | Ceramic | 1.000 | 0.983 | 0.971 | 0.946 | 0.930 | 0.900 | 0.875 | 0.828 |
| Example 4 | 0.20% | Ceramic via solid state reaction | 1.000 | 0.989 | 0.981 | 0.962 | 0.948 | 0.928 | 0.905 | 0.870 |
| Comparative Example 1 | 0.80% | Ceramic | 1.000 | 0.984 | 0.969 | 0.937 | 0.915 | 0.884 | 0.838 | 0.778 |
| Comparative Example 2 | 2.00% | Ceramic | 1.000 | 0.978 | 0.947 | 0.923 | 0.894 | 0.853 | 0.801 | 0.751 |
| Comparative Example 3 | 5.00% | Ceramic | 1.000 | 0.966 | 0.928 | 0.889 | 0.845 | 0.790 | 0.712 | 0.622 |
| Comparative Example 4 | N/A | Commercial YAG:Ce powder | 1.000 | 0.976 | 0.938 | 0.892 | 0.833 | 0.745 | 0.662 | 0.533 |
| Example 3a (Y/Gd) | Ce = 0.20% Gd = 2.00% | Ceramic | 1.000 | 1.000 | 0.998 | 0.996 | 0.992 | 0.980 | 0.957 | 0.941 |

EXAMPLE 5

In Example 1, a thinner luminescent ceramic disc was prepared by spreading out 95 mg of said dried powder into the same die set with 13 mm of diameter. After sintering at 1600° C. for 5 hours in vacuum, a yellow colored translucent YAG: Ce ceramic disc with thickness about 240 micrometer was obtained.

Total light transmittance of the obtained luminescent ceramic disc was measured by using the optical configuration shown in FIG. 7. FIG. 7 shows a schematic of the device used to measure the total light transmittance through the luminescent ceramic 45 prepared as described above. An integrating sphere 20 is used to collect all the transmitted light 50, including scattered light. A baffle 25 is interposed between the detector 30 and the entrance to the sphere 20 to preclude direct impingement of the detector 30 by incident light 40. The backscattered light 35 is not transmitted into the integrating sphere and thus is undetectable by the detector 30. If the luminescent ceramic plate 45 contains substantial air voids or defects, the total light transmittance tends to be low. If the wavelength of an incident light 40 overlaps with the absorption region of the phosphor materials used to make the sintered ceramic plate 45, the transmittance will not be measured because the incident light is mostly dissipated by phosphor absorption. Therefore, total light transmittance measurement was performed by selecting a wavelength at which the luminescent ceramic does not absorb the impinging light.

COMPARATIVE EXAMPLE 5

Casting type epoxy resin (0.4 g) was mixed with commercial YAG:Ce phosphor powder (0.6 g, Kasei Optonix, Ltd P46-Y3). The mixed solution was mounted onto the same type of blue LED chip used in Example 5, followed by being temporally cured at 135° C. for 30 min. Since the emission color was yellowish rather than white, the phosphor dispersed epoxy resin layer was carefully scratched by using sand paper until the emission color became white. This was followed by full curing at 135° C. for 5 hours.

A LED device with a commercial YAG:Ce phosphor powder was driven, and white color emission was observed.

COMPARATIVE EXAMPLE 6

A nano-sized powder similar to that described in Example 1, obtained right after plasma processing ($D_{ave}$=87 nm) was annealed at 1400° C. for 2 hours under the $H_2/N_2$=3%/97% mixture gas ambient. The obtained powder showed a single YAG phase. The color was yellow but much paler than the commercial YAG:Ce powder used in Comparative Example 6.

Casting type epoxy resin (0.5 g) was mixed with YAG:Ce powder (0.5 g) By the same method described in Comparative Example 6, a LED device with YAG:Ce phosphor powder was driven, and white color emission was observed.

LED Performance Test

White light emission spectra for each LED were acquired by using Otsuka Electronics MCPD 7000 multi channel photo detector system (Osaka, Japan) together with associated optical components such as integrating spheres, optical fibers, and DC power source. Emission spectra under a driving condition of 20 mA were acquired for each LED device.

Figure 8:
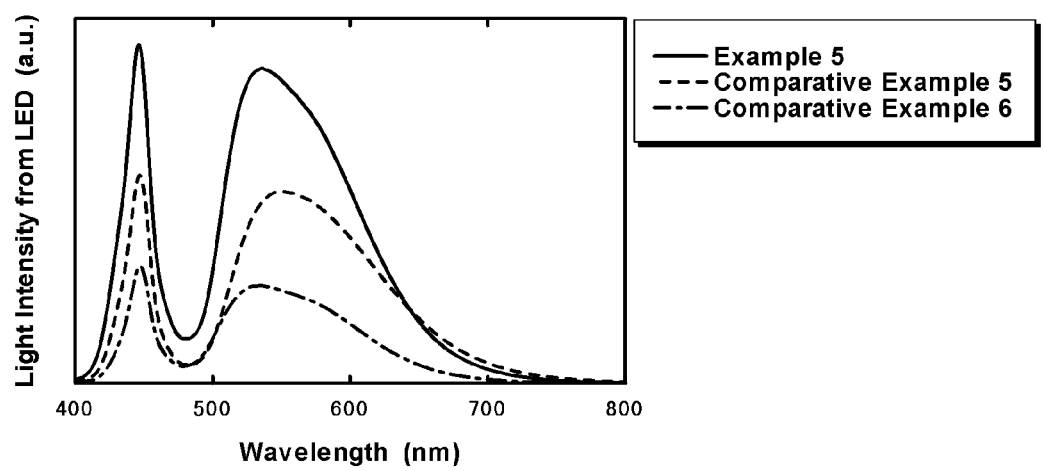
FIG. 8 shows emission spectra of some embodiments of an LED device at a driving condition of 20 mA.

FIG. 8 shows emission spectra of each LED device at a driving condition of 20 mA. The spectra were obtained without normalizing acquired data. Subsequently, the driving current was increased stepwise as 100 mA, 200 mA, 300 mA, 400 mA, and 500 mA. In order to allow the temperature of the LED to stabilize, emission spectra were acquired about 1 minute later after changing the driving current. The emission color variation of the devices of Example 5 with different driving condition was less sensitive than the device of Comparative Example 5.

CIE chromaticity variation on driving current of Example 5 and Comparative Example 5 are given in Table A

TABLE A

| | CIE Chromaticity | | | |
|---|---|---|---|---|
| | Example 5 | | Comparative Example 5 | |
| LED Driving Current | x | y | x | y |
| 100 mA | 0.3312 | 0.4105 | 0.3633 | 0.4025 |
| 200 mA | 0.3293 | 0.4050 | 0.3587 | 0.3946 |
| 300 mA | 0.3275 | 0.4002 | 0.3551 | 0.3882 |
| 400 mA | 0.3262 | 0.3963 | 0.3519 | 0.3821 |
| 500 mA | 0.3248 | 0.3925 | 0.3491 | 0.3771 |
| Δ(100 mA-500 mA) | 0.0064 | 0.0180 | 0.0142 | 0.0254 |

What is claimed is:

1. A luminescent ceramic comprising:
   a polycrystalline phosphor represented by the formula $(A_{1-x}E_x)_3B_5O_{12}$;
   wherein A comprises Y and Gd;
   x is in the range of about 0.0001 to about 0.004;
   B is Al; and
   E is Ce;
   wherein the ceramic has a wavelength of maximum absorbance in the range of about 420 nm to about 480 nm, and wherein said ceramic has a first luminescent efficiency at 200° C. and a second luminescent efficiency at 25° C., wherein the first luminescent efficiency is at least about 82% of the second luminescent efficiency.

2. The ceramic of claim 1, wherein the ceramic emits light having a wavelength of maximum emission in the range of about 500 nm to about 750 nm.

3. The ceramic of claim 1, wherein no more than about 0.05 mole percent of A is the Gd.

4. The ceramic of claim 1, wherein the phosphor is further represented by the formula $(Y_{1-(x+y)}Gd_yCe_x)_3B_5O_{12}$, wherein y is in the range of about 0.005 to about 0.05.

5. The ceramic of claim 1, wherein x is in the range of about 0.0001 to about 0.003.

6. The ceramic of claim 1, wherein the phosphor is further represented by the formula $(Y_{0.978}Gd_{0.02}Ce_{0.002})_3Al_5O_{12}$.

7. The ceramic of claim 1, further comprising a second component different from the polycrystalline phosphor.

8. The ceramic of claim 7, wherein said second component is selected from alumina, yttria, and yttrium aluminum oxide.

9. A light-emitting device comprising:
   a light-emitting diode having a wavelength of maximum emission in the range of about 420 nm to about 480 nm, and
   a luminescent ceramic according to claim 1, wherein the luminescent ceramic is positioned to receive and convert at least a portion of the light emitted from the light-emitting diode to light having a wavelength of maximum emission in the range of about 500 nm to about 700 nm.

10. The light-emitting device of claim 9, wherein said luminescent ceramic has a thickness in the range of about 50 μm to about 5 mm.

11. The light-emitting device of claim 9, wherein the total light transmittance of said luminescent ceramic is greater than or equal to about 50%.

12. The light-emitting device of claim 9, wherein x is in the range of about 0.0001 to about 0.002.

13. The light-emitting device of claim 9, wherein the phosphor is further represented by the formula $(Y_{1-(x+y)}Gd_yCe_x)_3B_5O_{12}$, wherein y is in the range of about 0.005 to about 0.05.

14. The light-emitting device of claim 9, further comprising at least a second ceramic component.

15. The light-emitting device of claim 14, wherein the second component is selected from alumina, yttria, and yttrium aluminum oxide.

16. The luminescent ceramic of claim 1, wherein x is in the range of about 0.0001 to about 0.002.

17. The luminescent ceramic of claim 1, wherein the luminescent ceramic is substantially void-free.

* * * * *